US006956659B2

(12) United States Patent
Grodnensky (10) Patent No.: US 6,956,659 B2
(45) Date of Patent: Oct. 18, 2005

(54) MEASUREMENT OF CRITICAL DIMENSIONS OF ETCHED FEATURES

(75) Inventor: Ilya Grodnensky, Foster City, CA (US)

(73) Assignee: Nikon Precision Inc., Belmont, CA (US)

(*) Notice: Subject to any disclaimer, the term of this patent is extended or adjusted under 35 U.S.C. 154(b) by 496 days.

(21) Appl. No.: 10/165,733

(22) Filed: Jun. 7, 2002

(65) Prior Publication Data

US 2002/0177057 A1 Nov. 28, 2002

Related U.S. Application Data

(63) Continuation-in-part of application No. 09/861,541, filed on May 22, 2001, now Pat. No. 6,538,753.

(60) Provisional application No. 60/378,487, filed on May 6, 2002.

(51) Int. Cl.$^7$ .............................................. G01B 11/02
(52) U.S. Cl. ...................... 356/625; 356/635; 355/77; 355/53; 430/5
(58) Field of Search .................. 356/237.1–237.5, 356/399–401, 625–632; 355/53, 77, 50, 67; 430/5, 20, 22, 30; 250/458

(56) References Cited

U.S. PATENT DOCUMENTS

| | | |
|---|---|---|
| 4,396,849 A | 8/1983 | Taiani |
| 4,433,911 A | 2/1984 | Sawada et al. |
| 4,521,686 A | 6/1985 | Coates et al. |
| 4,549,084 A | 10/1985 | Markle |
| 4,585,342 A | 4/1986 | Lin et al. |
| 4,677,301 A | 6/1987 | Tanimoto et al. |
| 4,744,662 A | 5/1988 | Suto et al. |
| 4,759,626 A | 7/1988 | Kroko |
| 4,772,119 A | 9/1988 | Bouwhuis et al. |
| 4,774,158 A | 9/1988 | Vervoordeldonk et al. |
| 4,803,524 A | 2/1989 | Ohno et al. |
| 4,908,656 A | 3/1990 | Suwa et al. |
| 4,959,326 A | 9/1990 | Roman et al. |
| 5,044,750 A | 9/1991 | Shamble |

(Continued)

FOREIGN PATENT DOCUMENTS

EP 502583 A1 9/1992

(Continued)

OTHER PUBLICATIONS

U.S. Appl. No. 09/861,541, filed May 22, 2001 (w/filing receipt).

(Continued)

Primary Examiner—Hoa Q. Pham
(74) Attorney, Agent, or Firm—Beyer Weaver & Thomas, LLP (57) ABSTRACT

A test mark, as well as methods for forming and using the test mark to facilitate the measurement of the critical dimensions of etched features in semiconductor and other wafer level processing is described. The test marks may be used to characterize, calibrate and/or monitor etch performance. Test marks are defined by imaging (typically at partial exposures) overlapping, angularly offset lines in a resist that covers a layer to be etched. The lines preferably have line widths that are equal (or related) to a critical dimension of interest. After the resist is developed and otherwise processed, the layer is etched as appropriate, thereby creating the test marks. The test marks are then imaged to facilitate the determination of a geometric parameter of each mark. Most commonly, the geometric parameter determined relates to the area of the mark and/or the length of its major dimension. These parameters can then be used to approximate a critical dimension of interest based at least in part on the determined geometric parameter of the test mark.

30 Claims, 4 Drawing Sheets

U.S. PATENT DOCUMENTS

| | | | |
|---|---|---|---|
| 5,049,925 A | 9/1991 | Aiton et al. | |
| 5,111,240 A | 5/1992 | Boettiger et al. | |
| 5,140,366 A | 8/1992 | Shiozawa et al. | |
| 5,247,329 A | 9/1993 | Oshida et al. | |
| 5,262,822 A | 11/1993 | Kosugi et al. | |
| 5,300,786 A | 4/1994 | Brunner et al. | |
| 5,362,585 A | 11/1994 | Adams | |
| 5,408,083 A | 4/1995 | Hirukawa et al. | |
| 5,440,138 A | 8/1995 | Nishi | |
| 5,450,205 A * | 9/1995 | Sawin et al. | 356/632 |
| 5,508,803 A | 4/1996 | Hibbs et al. | |
| 5,573,634 A | 11/1996 | Ham | |
| 5,615,006 A | 3/1997 | Hirukawa et al. | |
| 5,656,403 A | 8/1997 | Shieh | |
| 5,666,205 A * | 9/1997 | Tateno et al. | 356/401 |
| 5,686,223 A | 11/1997 | Cleeves | |
| 5,702,868 A | 12/1997 | Kellam et al. | |
| 5,747,202 A | 5/1998 | Tanaka | |
| 5,776,645 A | 7/1998 | Barr et al. | |
| 5,789,734 A | 8/1998 | Torigoe et al. | |
| 5,808,731 A | 9/1998 | Kirk | |
| 5,914,784 A | 6/1999 | Ausschnitt et al. | |
| 5,953,128 A | 9/1999 | Ausschnitt et al. | |
| 5,965,309 A | 10/1999 | Ausschnitt et al. | |
| 5,968,693 A | 10/1999 | Adams | |
| 5,973,773 A | 10/1999 | Kobayashi | |
| 5,976,740 A | 11/1999 | Ausschnitt et al. | |
| 5,981,119 A | 11/1999 | Adams | |
| 5,985,495 A | 11/1999 | Okumura et al. | |
| 5,985,498 A | 11/1999 | Levinson et al. | |
| 5,989,764 A | 11/1999 | Adams | |
| 5,991,006 A | 11/1999 | Tsudaka | |
| 6,004,706 A | 12/1999 | Ausschnitt et al. | |
| 6,057,908 A | 5/2000 | Ota | |
| 6,063,531 A | 5/2000 | Singh et al. | |
| 6,088,113 A | 7/2000 | Kim | |
| 6,094,256 A | 7/2000 | Grodnensky et al. | |
| 6,128,089 A | 10/2000 | Ausschnitt et al. | |
| 6,130,750 A | 10/2000 | Ausschnitt et al. | |
| 6,137,578 A | 10/2000 | Ausschnitt | |
| 6,166,801 A | 12/2000 | Dishon et al. | |
| 6,226,074 B1 | 5/2001 | Fujisawa et al. | |
| 6,296,977 B1 | 10/2001 | Kaise et al. | |
| 6,317,211 B1 | 11/2001 | Ausschnitt et al. | |
| 6,323,938 B1 | 11/2001 | Grodnensky et al. | |
| 6,323,945 B1 | 11/2001 | Saito | |
| 6,338,926 B1 | 1/2002 | Ku et al. | |

FOREIGN PATENT DOCUMENTS

| | | |
|---|---|---|
| EP | 973068 A2 | 1/2000 |
| EP | 992855 A1 | 4/2000 |
| EP | 1065567 A2 | 1/2001 |
| JP | 62-115830 | 5/1987 |
| JP | 62-247525 | 10/1987 |
| JP | 1-187817 | 7/1989 |
| JP | 2-30112 | 1/1990 |
| JP | 2-31142 | 2/1990 |
| JP | 4-209518 | 7/1992 |
| JP | 4-324615 | 11/1992 |
| JP | 5-62882 | 3/1993 |
| JP | 405129238 A * | 5/1993 |
| JP | 5-217872 | 8/1993 |
| JP | 1128217 A2 | 8/2001 |
| JP | 1160626 A1 | 12/2001 |
| WO | WO 92/11609 | 7/1992 |
| WO | WO 01/84382 A1 | 11/2001 |

OTHER PUBLICATIONS

Arnold et al., "A focus vernier for optical lithography", (1993) SPIE vol. 1926, pp. 380-392.

Brunner et al., "A Stepper Image Monitor for Precise Setup and Characterization", (1988) SPIE vol. 922, Optical/Laser Microlithography, pp. 366-375.

Liu et al., "The Application of Alternating Phase-shifting Masks to 140 nm Gate Patterning (II): Mask Design and Manufacturing Tolerances", (1998) SPIE vol. 3334, pp. 2-14.

Kirk, "Astigmatism and field curvature from pin-bars", (1991) SPIE vol. 1463 Optical/Laser Microlithography IV, pp. 282-291.

Schneider et al., "Automated Photolithography Critical Dimension Controls In A Complex, Mixed Technology, Manufacturing Fab", (2001) IEEE/SEMI Adv. Semi. Mfging. Conf., pp. 33-40.

Ronse et al., "CD Control Comparison of Step & Repeat versus Step & Scan DUV Lithography for sub-0.25 $\mu$m gate printing", (1998) SPIE vol. 3334, pp. 58-66.

Wong et al., "Characterization of line width variation", (2000) SPIE: vol. 4000, pp. 184-191.

Zavecz et al., "Critical Dimension Uniformity Prediction And A-Method Of Discrimination Between Exposure Tool And Process Induced Variation Using Empiriical Focal Plane Modeling", (1997) TEA Sys. Corp., pp. 155-161.

Ferguson et al., "Data analysis methods for evaluating lithographic performance", (1997) J. Vac. Sci. Tecnol. B 15(6), pp. 2387-2393.

Sohail et al., "Diffractive techniques for lithographic process monitoring and control", (1994) J. Vac. Sci. Technol. B 12(6), pp. 3600-3006.

Starikov, "Exposure Monitor Structure", (1990) SPIE vol. 1261, Integrated Circuit Metrology, Inspection, and Process Control IV, pp. 315-324.

Rosner et al., "Fourier Analysis Determination of Best Focus in Sub-micron Lithography", (1994) SPIE vol. 2196, pp. 314-320.

Brunner, "Impact of lens aberrations on optical lithography", (1997) IBM J. Res. Develop., vol. 41 No. 1/2, pp. 57-67

Brunner et al., "In Situ Resolution and Overlay Measurement on a Stepper", (1985) SPIE vol. 565 Micron and Submicron Integrated Circuit Metrology, pp. 6-13.

Singh et al., "Linewidth Measurement by Low Voltage SEM", (1988) SPIE vol. 921, Integrated Circuit Metrology, Inspection, and Process Control II, pp. 16-21.

Milner et al., "Lithography process monitor using light diffracted from a latent image", (1993) SPIE vol. 1926, pp. 94-105.

Kirk, "Measurement of astigmatism in microlithography lenses", (1998) SPIE vol. 3334, pp. 848-854.

Kirk et al., "Measurement of microlithography aerial image quality", (1996) SPIE vol. 2726, pp. 410-416.

Murray, "Measuring dimensions Using Murray Daggers", (Dec. 1982) Semiconductor Int'l, pp. 70-73.

Kirk, "Measuring the aerial image with an atomic force microscope", (1997) Microlithography World, pp. 4-9.

Brunner, "New Focus Metrology Technique Using Special Test Mask", (1994) Microlithography World, pp. 5-13.

Finders et al., "Optimizing i-line lithography for 0.3$\mu$m poly-gate manufacturing", (Mar. 1997)Solid State Technology, 11 pp.

Wheeler et al., "Phase Shift Focus Monitor Applications To Lithography Tool Control", (1997) SPIE vol. 3051, pp. 225-233.

Ausschnitt et al., "Process window metrology", (2000) SPIE vol. 3998, pp. 158-166.

Brunner et al., "Quantitative stepper metrology using the focus monitor test mask", (1994) SPIE vol. 2197, pp. 541-549.

Ausschnitt, "Rapid Optimization of the Lithographic Process Window", (1989) SPIE vol. 1088, Optical/Laser Microlithography II, pp. 115-123.

Kirk, "Review of photoresist based lens evaluation methods", (2000) SPIE vol. 4000, pp. 2-8.

Kivenzor, "Self-Sustaining Dose Control System: Ways to Improve the Exposure Process", (2000) SPIE vol. 4000, Optical Microlithography XIII, pp. 835-842.

Brunner, "Simulations and experiments with the phase shift focus monitor", (1996) SPIE vol. 2726, pp. 236-243.

Tan et al., "SMART SET™—An Integrated Approach to Stepper Set-Up and Calibration", (1985) SPIE vol. 565 Micron and Submicron Integrated Circuit Metrology, pp. 45-55.

Wilder et al., "Sub-0.35-micron critical dimension metrology using atomic force microscopy", (1996) SPIE vol. 2725, pp. 540-554.

Grodnensky et al., "Technique for optical characterization of exposure tool imaging performance down to 100nm", (1999) J. Vac.Sci.Technol. B 17(6), pp. 3285-3290.

Arnold, "Thinking small: challenges for metrology at century's end", (1997) SPIE vol. 3050, pp. 2-9.

Progler et al., "Understanding The Effect Of Pitch on Linewidth Control", (1996) Olin Microelectronic Materials, Olin Microlithography Seminar, pp. 141-157.

Martin et al., "Using the focus monitor test mask to characterize lithographic performance", (1995) SPIE vol. 2440, pp. 657-666.

Monahan et al., "Yield Impact of Cross-Field and Cross-Wafer CD Spatial Uniformity: Collapse of the Deep-UV and 193nm Lithographic Focus Window", (1999) IEEE, pp. 115-118.

IBM Technical Disclosure Bulletin, "Multilayer Circuit Fabrication using Double Exposure of Positive Resist", Oct. 1993, IBM Corp., vol. 36, No. 10, pp. 423-424.

Putnam et al., "Scanner Focus and CD Response Characterization Metrology For Sub 180nm Lithography," Nikon Precision Inc., 9 pg.

* cited by examiner

MEASUREMENT OF CRITICAL DIMENSIONS OF ETCHED FEATURES

CROSS REFERENCE TO RELATED APPLICATION

This application claims priority of provisional application No. 60/378,487, filed May 6, 2002 and is a continuation-in-part of U.S. patent application Ser. No. 09/861,541 filed May 22, 2001 now Pat. No. 6,538,753, which is incorporated herein by reference in its entirety. The present invention also relates generally to U.S. Pat. No. 6,094,256, which is incorporated herein by reference in its entirety.

BACKGROUND OF THE INVENTION

The present invention relates generally to the measurement of critical dimensions in semiconductor processing. More particularly, it relates to the measurement of critical dimensions of etched features.

In the semiconductor industry, it is widely recognized that reducing the size of electrical elements (e.g. transistors, capacitors, interconnects and the like) in integrated circuits has the potential to provide a number of benefits in terms of device performance and functionality. Increased proximity of devices generally reduces signal propagation time and increases noise immunity while increased numbers of electrical elements on a chip of a given size generally allow increased circuit complexity and additional signal processing functions to be provided. Improved economy of manufacture also generally results from increased integration density since more electrical elements can be simultaneously formed by a given process. Therefore, there are ongoing efforts to develop technologies that facilitate the fabrication of integrated circuits having smaller and more densely packed electrical components. By way of example, some current state of the art technologies incorporate 0.18 $\mu$m (micron) line width design rules. The industry is currently developing devices implementing next generation design rules (e.g., 0.13 $\mu$m, 0.08 $\mu$m etc.) and it is fully expected that in the coming years these dimensions will be further reduced.

One important aspect of semiconductor processing is the precise control of the critical dimensions (e.g. width) of the various electrical elements that are formed within an integrated circuit. Therefore, over the years, extensive efforts have been made to facilitate the measurement of critical dimensions. It should be appreciated that there are a number of stages in the fabrication process where the measurement of critical dimensions becomes important. For example, the measurement of critical dimensions is perceived to be critical during the lithographic process. A lithographic process generally includes the exposure of a resist with some form of energy (e.g. light, charged particles, x-rays, etc.) to which the resist is sensitive in a pattern which is subsequently developed to remove selected areas of the resist to allow processes to be selectively carried out where resist has been removed. Generally, at least one lithographic process is required for the formation of any active or passive electrical element in order to define its location and its basic dimensions.

In state of the art semiconductor processing, some of the semiconductor structures being formed have dimensions smaller than lithographic resolution. Therefore, the quality of the exposure of the resist is of paramount importance to the formation of integrated circuits in accordance with a given design. Accordingly, there have been extensive efforts to develop techniques for accurately measuring critical dimensions in lithography processes. By way of example, in U.S. Pat. No. 6,094,256 (which is incorporated herein by reference), the present inventor (and others) proposed the optical measurement of the length of specially designed test marks to facilitate the calculation of critical dimensions in photoresists The measured mark is formed by the exposure of a particular feature (e.g. a line, bar, etc.) at each of two overlapping orientations that are rotated about an axis with respect to each other. In pending U.S. patent application Ser. No. 09/861,541, filed May 22, 2001 (which is also incorporated herein by reference), an improvement of this process which effectively measures the areas of the test marks is described.

Another area where the measurement of critical dimensions is very important relates to etch monitoring and characterization. A wide variety of etching processes are typically used during semiconductor fabrication. Since etching involves chemical reactions which may be influenced by a wide variety of factors, it can be difficult to precisely control etch processes and it is not uncommon for the characteristics of a particular etch process to vary over time. Therefore, extensive efforts are typically made to measure the critical dimensions of etched features. However, the current critical dimension measurement (or inference) techniques have a number of drawbacks. Some require the periodic insertion of special (and expensive) test wafers into the production stream. The test wafer are processed using normal production techniques and then removed from the production line to facilitate electrical testing which is used to infer the critical dimensions. In other techniques, normal wafers are pulled from the production line and scanned (using, for example, scanning electron microscopes) to determine critical dimensions. Although such techniques do provide useful information, they tend to be expensive and/or slow and/or reduce production yield.

By way of background, critical dimensions that are relatively large by current standards could be directly measured by inspection with a scanning electron microscope using the current of back-scattered electrons to detect the edges of the features including the critical dimension of interest. However, this technique requires a relatively long period of time to complete (e.g. 10 seconds) and precision is limited to about five nanometers.

When evaluating critical dimensions within a wafer, it is generally desirable to perform numerous measurements (e.g. a few dozen to several hundred sites per field over a matrix of several dozen fields on a wafer). This permits the detection of variations that may occur across the face of the wafer. Such numbers of measurements require substantial time, particularly when about ten seconds are required for each individual measurement with electron microscopy, as alluded to above. Further, scanning electron microscopy requires measurements to be made at high vacuum levels, which takes additional time to achieve. Such a long measurement time adversely impacts throughput, especially in a manufacturing environment. Additionally, precision of about or less than one nanometer is required for integrated circuit designs at the current state of the art. Increasing electron beam power to reduce measurement time and/or increase precision tends to erode the pattern being measured. Other problems have also been associated with scanning electron microscope measurements to test in the manufacturing environment. For example, the nature of electron microscopy requires bombardment of a substrate with particles and the resultant secondary emissions that are captured for imaging can contaminate devices in integrated circuits adjacent the test patterns when applied to manufacturing environments. In such environments, the wafer used for the test exposure is often discarded or the resist removed and the wafer reprocessed without measurements being concurrently made. Moreover, the cost of specialized electron microscope measurements coupled with the low throughput thereof add significantly to the cost of integrated circuit manufacture.

Another critical dimension measurement technique employs an electrical measurement of an array of test structures. The test structures used in this process are formed in a conductive layer overlying a special test substrate where the structures have attached contact regions. Thus, a resist layer is exposed and the pattern of test structures developed and etched. After removing the resist layer, the conductivity of the etched features are measured by an electrical means. Using such parameters as the specific electro-conductivity of the conductive layer and the length of the etched feature, a linewidth is calculated. However, as the procedure involves a special substrate this tends to be a very expensive approach to critical dimension measurement.

Although the existing techniques do provide information that is useful in inferring critical dimensions of features within an integrated circuit, there are continuing efforts to further improve the measurement of critical dimensions of etched features.

SUMMARY OF THE INVENTION

To achieve the foregoing, a method of determining a critical dimension associated with an etch process is described. One or more strategically placed test marks are lithographically defined by imaging (typically at partial exposures) overlapping, angularly offset lines in a resist that covers a layer to be etched. The lines preferably have line widths that are equal (or related) to a critical dimension of interest. After the resist is developed and otherwise processed, the layer is etched as appropriate, thereby creating the test marks. The test marks are then measured (which may, for example be accomplished by imaging) to facilitate the determination of a geometric parameter of each mark. Most commonly, the geometric parameter determined relates to the area of the mark and/or the length of its major dimension. These parameters can then be used to approximate a critical dimension of interest based at least in part on the determined geometric parameter of the test mark. It should be appreciated that when straight lines having widths equal to (or related to) a critical dimension of are used to define the test mark, the resulting test marks are theoretically substantially diamond or rhombus shaped and the area of the marks, the length of the marks major and minor dimensions, as well as their height and width are all geometrically related to the critical dimension of interest.

The methodology can be used in a variety of applications including etch characterization, etch calibration and/or the monitoring of etch processes (as for example production quality control and the like). The described methodology can be used to determine critical dimensions in integrated circuits as well as other devices that are formed using wafer processing techniques (e.g., biometric arrays, MEMS, etc.). In the context of integrated circuits, the features measured can be in any layer including bulk layers, semiconductor layers, insulating layers, and conducting layers.

The angular offset between the lines that define the test mark is preferably quite small, as for example, between 0.2 and 10 degrees. In practice, at these angles it is often necessary and/or desirable to utilize an empirically determined normalization factor (which may be a constant) to facilitate the calculation of the desired critical dimension.

In another aspect of the invention, equipment is provided for imaging test marks formed on a wafer. The imaging equipment may be stand alone equipment or integrated into an etch machine or other wafer production equipment.

BRIEF DESCRIPTION OF THE DRAWINGS

The invention may best be understood by reference to the following description taken in conjunction with the accompanying drawings in which.

DETAILED DESCRIPTION OF THE EMBODIMENTS

U.S. Pat. No. 6,094,256 and application Ser. No. 09/861, 541, (both of which are incorporated herein by reference) teach the measurement of a test mark having a length much larger than a critical dimension of interest in order to provide an indirect measurement of the critical dimension in lithographic masks. In the '256 patent, the length of the test mark is measured to infer the critical dimension of interest. In the '541 application, the area of the mark is effectively measured. The present invention generally applies these principles to the measurement of critical dimensions of etched features in integrated circuit devices.

Briefly, test marks may be created along with other features in a particular layer of an integrated circuit (or in a test wafer). The test marks are defined during the lithography of the layer by taking overlapping partial lithographic exposures of one or more test line patterns (where the critical dimension is the line width). The overlapping exposures are made with the test line patterns displaced through a small angle between partial exposures. The test marks are then formed as part of the normal processing for the layer of interest (which typically includes etching). When two angularly displaced overlapping partial exposures are made, this technique theoretically causes the formation of an array pattern of small parallelograms or rhombus shaped test marks (often referred to as diamond shaped hereinafter). Both the major dimension of the test mark (i.e., the length between the two most widely separated points) and the area of the test mark are geometrically related to the critical dimension (CD), by the offset angle between the partial exposures. Accordingly, the critical dimension of the test mark can be inferred by measuring either the length or the area of the test marks.

Figure 1:
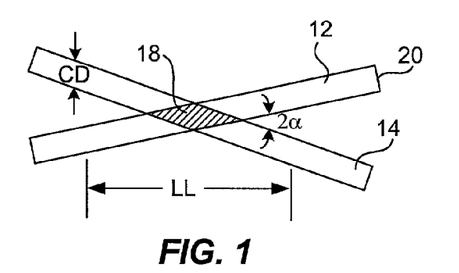
FIG. 1 illustrates overlapping lithographic exposures suitable for use in the formation of a test mark in accordance with one embodiment of the present invention.

Referring next to the figures, the invention will be described in more detail. As illustrated in FIG. 1, a substantially diamond shaped test mark can be defined in a photoresist by overlapping two angularly offset lithographic lines 12 and 14. The lines 12, 14 preferably have widths equal to the critical dimensions of interest, although their width could be varied in a known way from the critical dimension. These line features may be either effectively transparent or opaque in the reticle used for their formation (depending on whether a positive or negative imaging response is utilized) and the structure thereof is not critical to the practice of the invention but need only be appropriate to the exposure energy or medium for which the exposure tool is designed. For example, for a charged particle beam tool, the features (or surrounding area) may be apertures through a reticle structure or apertures only in a scattering material such as a high atomic weight metal on a silicon substrate. For short wavelength light exposure tools, the features may include phase shift enhancement features appropriate to the critical dimension to be exposed, which are well understood in the art.

The non-linearity of modern resists tends to enhance and simplify the formation of the diamond shaped test marks. For example, many positive resists (i.e., resists wherein an exposed area becomes soluble), have non-linear activation profiles so that a half exposure by the lithography tool is sufficient to cause activation of the resist. Therefore, when a first line 12 is exposed at a partial exposure, everything outside the exposed line becomes substantially soluble. The second line 14 is positioned to overlap the first line 12 but to be angularly offset from the overlapped first line by a small angle "$2\alpha$." It is noted that the total offset angle is described as "$2\alpha$" (as opposed to simply "$\alpha$") herein to simplify the math used to illustrate the invention below. The second line is also partially exposed which causes the activation of the portion of the first line 12 that lies outside of the diamond shaped overlapping region of the lines. Therefore, after the resist is developed and rinsed, only the diamond shaped test marks (and other desired features) remain. Of course, the appropriate exposure doses to accomplish the desired effect may be widely varied and will depend in great part on the nature of the resist being used.

The total offset angle $2\alpha$ may also be widely varied. By way of example, angular offsets in the range of 0.2 to 10 degrees are believed to work well in particular applications, although the specific angle used is typically not critical to the successful practice of the invention. In general, the angle $\alpha$ is preferably chosen to be as small as possible consistent with avoiding a significant degree of instability of the tips of the test mark to be generated. In experiments conducted to date, half offset angles between 1° and 4° have provided reliable and consistent results with current resists and etch technology. However, based on the non-linear response of modern resists it is expected that with resists of reduced thickness, smaller angles (e.g. 0.5° or less) would be reliable. Of course, as resist technology improves even smaller angles (e.g. 0.2 degrees or less) are expected to be achievable reliably as well.

Figure 2:
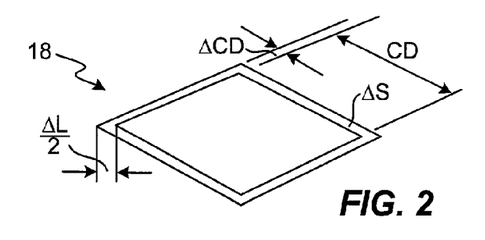
FIG. 2 illustrates the geometry of a theoretical test mark in accordance with the invention and variations thereof.

The overlapping lines form a rhombus shaped test feature 18 in the photoresist mask (it should be appreciated that the offset angle $2\alpha$ is exaggerated in the drawing). After processing of the underlying layer, a test mark 18 as illustrated in FIG. 2 results. The length "L" of the test mark feature 18 is related to the angle $\alpha$ and the line width (CD) by the formula:

$$L=(CD/\sin\alpha)K$$

K is simply an empirically determined correction coefficient that corrects for errors induced by the lithographic or etching processes. It should be appreciated that for a particular lithographic/etching process in conjunction with a particular CD, that K will typically be a constant (e.g., a resist constant). However, in some situations it may be a function of some process variable. In practice, resist constants on the order of 1.0 to 1.2 are appropriate for many modem resists. Since $\sin\alpha$ is very small at small angles, the critical dimension CD is effectively multiplied in the measurement of L. The smaller the angle $\alpha$, the longer the length will be of the resulting test mark.

The area "A" of the photresist mask feature is related to the angle $\alpha$ and the line width (CD) by the formula:

$$A=CD^2/\sin 2\alpha M$$

Again, a smaller angle yields a larger area, effectively multiplying CD by a larger factor than the multiplication that occurs when the test mark length is determined at similar angles. Additionally, the area calculation has much reduced sensitivity to tip shape instability at very small angles, as will be discussed in greater detail below. M is the empirically determined correction coefficient (like K) that corrects for errors induced by the lithographic or etching processes.

The length of the line features 12, 14 used to define the test mark may be widely varied. However, they only need to be a dimension LL that is just slightly longer than the overlapping region in two partial exposures as illustrated in FIG. 1. Therefore, in production wafers, the test marks can be placed unobtrusively on unused portions of the wafer and/or even within integrated circuit chip patterns. For example, the regions of the wafers that correspond to the scribe lines that separate adjacent integrated circuits are typically sacrificed (i.e., they are typically cut along during singulation) and can provide good locations for test marks. Similarly, regions between different component blocks within an integrated circuit often have spaces large enough to accommodate the described test marks. Additionally, when extended, parallel conductors are provided, the spaces between the parallel lines can often be used to accommodate the test marks, with very little, if any, impact on the integrated circuit design. Further, areas near the periphery of the wafer outside the areas dedicated to the formation of integrated circuits are well suited for accommodating test marks.

It should be appreciated that the described marks can be used to both to characterize the etch process (or some sub-step thereof) and to monitor production. In some circumstances, the marks may be formed on special test wafers. In such wafers it is often not necessary to place the test marks unobtrusively on the wafer. Rather, the marks may be placed at any locations deemed desirable for the particular tests and/or characterizations being performed. By way of example, provisional application No. 60/373,85 filed Apr. 19, 2002 describes various arrangements for positioning test marks on a wafer in lithographic applications which may also be utilized for the test marks described herein.

Figure 4:
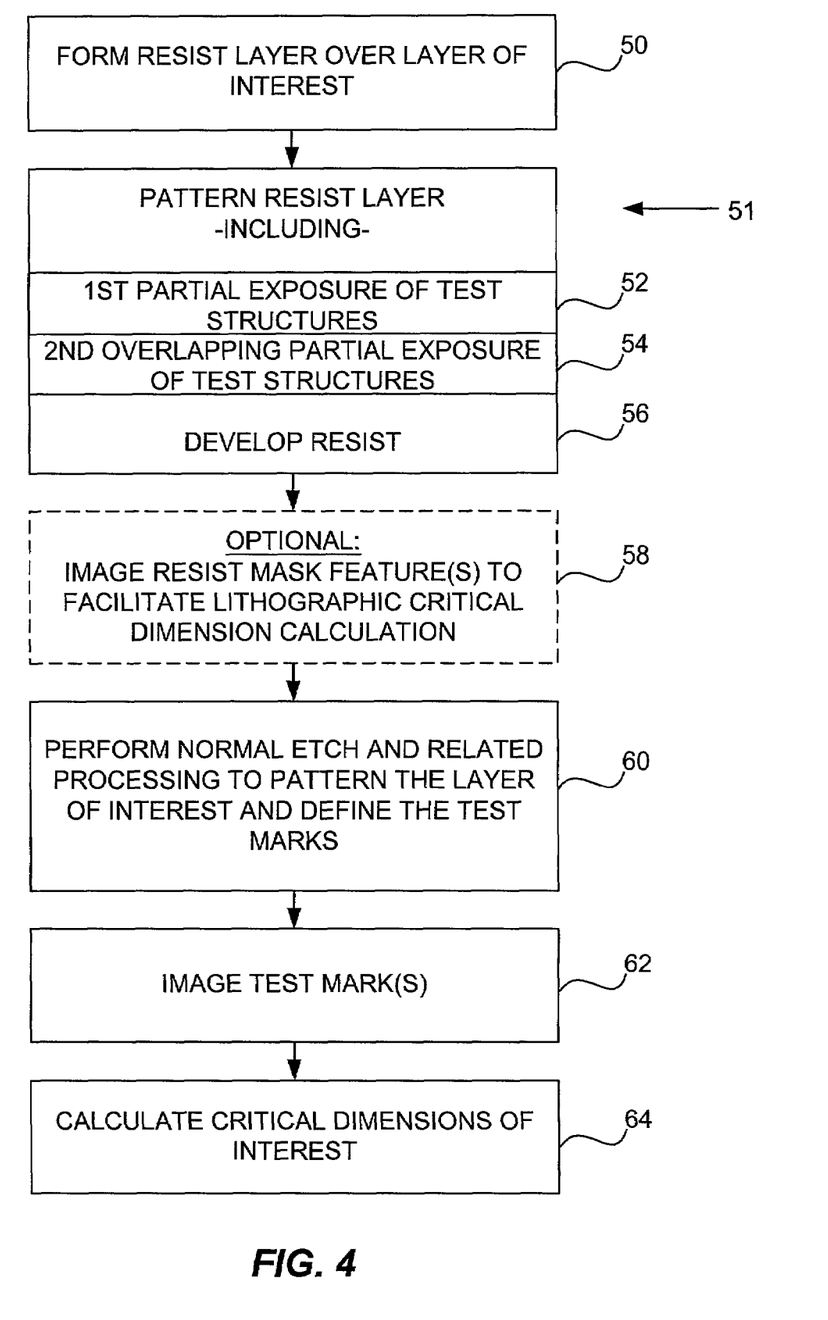
FIG. 4 is a flow chart illustrating a method of forming test mark in accordance with one embodiment of the invention.

Referring next to FIG. 4, a method of forming and then measuring the test marks in accordance with one embodiment of the invention will be described. The test marks can be formed on any layer in a semiconductor wafer or device in which the measurement of critical dimensions is of interest. By way of example, the measured layers can include bulk layers, semiconductor layers, insulator layers, conductive layers, interconnect layers, autoreflective layers etc. The interconnect layers may be formed in any suitable conductive material. At the time of this writing, aluminum, copper, tungsten, and titanium-tungsten alloys are among the most commonly used interconnect materials and the test marks may be formed in any of these layers. In silicon based devices, other common layers include polysilicon layers, silicon nitride layers, silicon oxide layers, silicon dioxide layers, etc. and the test marks may readily be formed in any such layers. Of course, the marks can be formed in the analogous layers of devices may from semiconductor materials other than silicon (e.g., Gallium Arsenide, Indium Gallium Phosphide, Silicon Germanium, etc).

In step 50 a resist layer such as a photoresist is applied over the layer of interest. The resist layer is then patterned as appropriate for the normal processing of the layer. When the wafer being patterned is a production wafer, then the normal processing would include the definition of the structures used in the semiconductor devices being produced. When the wafer being patterned is a test wafer, then the normal processing would typically include the definition of any structures of interest. In conjunction with the patterning, the critical dimension test features described herein are also defined by in the resist. Depending on the nature of the resist used, the test feature 18 may be defined in a variety of manners.

Figure 3:
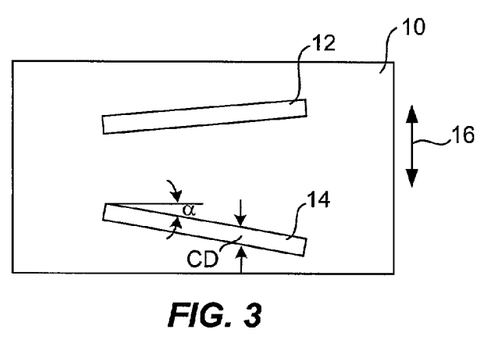
FIG. 3 is a diagrammatic representation of a segment of a reticle that includes line segments suitable for use in creating the test mark illustrated in FIG. 1.

As previously described, the resist test feature 18 may each be formed by initially imaging a first test line 12 (step 52) and then imaging an overlapping second test line 14 (step 54) that is angularly offset from the first line 12 by a small angle $2\alpha$. At small angles $2\alpha$, the offset is preferably provided in the feature placement on the reticle itself to assure simplicity of use by indexing in a single direction, without rotation of the reticle. This arrangement is diagrammatically illustrated in FIG. 3. However, the angular offset may also be provided by rotation of the reticle or other expedients as long as the relative rotation can be performed consistently.

As previously described, the resist test mark may be formed by two overlapping partial exposures. In step 52, a partial exposure of one of the features 12 is made. The wafer, the reticle or both are indexed relative to each other and the second feature 14 is partially exposed such that portions of features 12 and 14 overlap to form a rhombus shaped test structure. Other lithographic exposures may be made simultaneously with or before or after the overlapping (double) exposure. However, separate exposures will generally be made in situations where each exposure of the double exposure is made at a reduced exposure dose relative to the normal exposure.

After the patterning of the resist layer has been completed (including the overlapping exposures of all desired test structures 18), the resist is developed in step 56 and thereafter stripped to form the resist test marks. If desired the resist test marks can be measured to determine the critical dimensions that result from the lithographic process in step 58. By way of example, suitable testing processes are described in some detail in U.S. Pat. No. 6,094,256 and application Ser. No. 09/861,541. It should be appreciated that this step is entirely optional. If the primary purpose of the testing is only to track variations in the critical dimensions of the final product, then there may be no need to examine the wafer at this point. However, if the purpose of the testing is to specifically evaluate or characterize the nature of the etch chemistry, it may be desirable to first measure the marks defined by the lithography process in order to better account for variations induced by the lithographic process.

When it is desired to make a measurement of the critical dimensions in the resist, the mark is imaged or scanned by a sensor (e.g. a CCD array). The output signal from the sensor may vary from sensor to sensor and calibration will be necessary at least initially. Calibration may also vary with the angle at which the overlapping feature exposures are made. Accordingly calibration is preferably performed for each reticle used.

After the resist layer has been patterned (including the test marks), the layer of interest is processed in its normal manner in step 60. As will be appreciated by those familiar with the art, the actual number of steps that may be involved in processing the layer may be widely varied and may include a number of different steps. The processing steps typically include at least one etching process. Once the layer of interest has been processed as desired, the resulting test features are measured in step 62. This measurement may be accomplished in any suitable manner (for example, by imaging or scanning the test mark(s)) and again, it is typically desirable to calibrate the sensors based on the specific marks being made (e.g., separately calibrate for each reticle/process combination used). Both the imaging and the calibration will be described in more detail below. After the test features have been measured, the critical dimensions of interest may be calculated in step 64. The calculation of the critical dimensions is preferably performed automatically by a computing system which receives the scanning and/or imaging data directly from the sensors.

When the wafers are being evaluated as part of the monitoring of wafers produced on the production line, it is expected that the measurements of the test marks will typically occur after the layer has been completely processed. However, this is not a requirement. Rather, it should be appreciate that the test marks can be measured after any suitable step in the processing of the layer of interest. This may be particularly helpful in characterizing the effects that various steps of the production have on the critical dimensions of the ultimate product. It can also be useful in characterizing the processes (e.g. etch processes) themselves.

The test structure 18 is diagrammatically represented in enlarged form in FIG. 2. It should be appreciated that the size of the test structure will vary initially with lithographic variables such as focus, aberrations and/or exposure dose, development processing, and other variations in the lithographic process. The size of the test structure will potentially vary even further based on etching factors such as the nature of the etchant used and the materials etched, the strength of the etchant (which tends to vary over time during processing), the thickness of the layer etched, the duration of the etching, etc. The potential for variations in size is also illustrated in FIG. 2.

It should be noted that variations in the size of the mark do not generally result from misregistration of the overlap of features 12 and 14 as long as dimension LL is of adequate length that the end 20 of a feature 12, 14 is not imaged to corrupt the rhombus shape of the mark. Misregistration may slightly alter the location at which the mark is produced but such alteration of location is not important to the successful practice of the invention and the invention is inherently insensitive thereto.

Variations in the critical dimension of the lines that form the test mark 18 are significantly amplified in both the length of the major axis of the resultant mark 18 and the mark's area. The length of the mark $L = CD/\sin \alpha$ (or, more properly, the length measurement signal is proportional to $CD/\sin \alpha$)—for the purposes of clarity in the following description, the resists constant K (or M) will be ignored, however it should be understood that they will typically need to be considered. The change in the mark length (ΔL), is proportional to the difference in the critical dimensions divided by the offset angle. That is:

$$\Delta L = \Delta CD/\sin \alpha$$

As such, changes in the intensity of the length measurement signal are proportional to ΔCD/sin α. The sensitivity is thus:

$$\Delta L/L = \Delta CD/CD.$$

When the area is measured, the area signal "A" is:

$$A = CD^2/\sin 2\alpha$$

and $$\Delta A = 2CD\Delta CD/\sin 2\alpha$$

(taking the derivative of the expression for A). Thus the sensitivity of the area measurement in accordance with the invention is ΔA/A=2ΔCD/CD or inherently double the sensitivity of a length measurement however made and regardless of resolution. Moreover, the signal resulting from change in area is larger than the signal resulting from change in length for a given change in CD.

When the half offset angle α is very small, the detection of changes in the length of the test mark becomes increasingly difficult and subject to error due to increasing instability of the tips of the mark, as alluded to above. These measurements are also limited in resolution by the finite dimensions of the detector pixels. Area measurements tend to be less prone to errors, particularly with very small critical dimensions and smaller offset angles. The area measurements are inherently less sensitive to tip shape instability. In fact, since area varies as the square of the critical dimensions, a minimum gain in sensitivity of a factor of two results while the sensitivity is, in fact, further enhanced by several additional factors.

There are a number of tools that can be used to measure the length and/or the area of the test mark. By way of example, Laser Scanning Alignment (LSA) lasers, Overlay Measurement Systems, Displacement Measurement Systems and the like may be used to measure the lengths of the marks. There are also a number of sensitive tools available at relatively low cost that are suitable for the measurement of area. By way of example, tools such as CCD cameras, channel electron multipliers, photodiodes and the like may all be used to measure the areas of the marks. These area measuring devices generally have the additional advantage that they do not need extensive scanning, specialized illumination sources or specialized optical devices.

Figure 6:
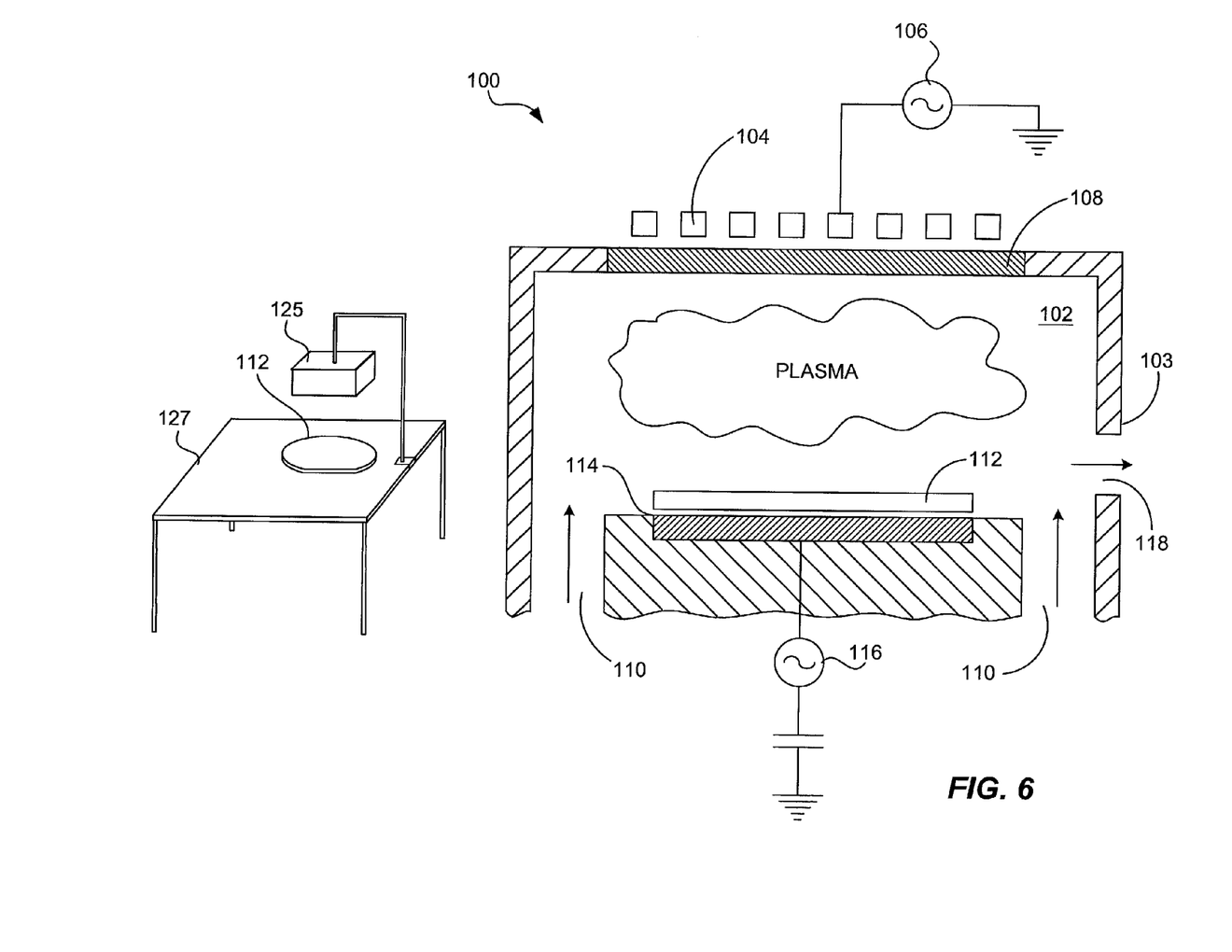
FIG. 6 is a diagrammatic illustration of an independent imager suitable for imaging test marks on a wafer.

The measurements of the test marks may be accomplished using dedicated test devices that are separate from the semiconductor manufacturing equipment used in the fabrication process as illustrated in FIG. 6. However, in many circumstances it will be desirable to provide the measurement tools together with the semiconductor manufacturing equipment or with inspection equipment that is used for other purposes. Alternatively, the measurement tools may be provided with the material handling equipment that delivers and/or extracts wafers from the etching machine or other equipment. In the earlier referenced applications, the integration of suitable measurement optics into the lithography equipment is described. Similarly, the measurement tools may be provided as part of the semiconductor manufacturing equipment used for etching or other purposes. By way of example, the detector may be incorporated into virtually any piece of semiconductor etching equipment, including equipment for plasma etching, chemical etching, ion enhanced etching, dry etching, sputtering, reactive ion etching (RIE), magnetically enhanced reactive ion etching (MERIE), electron cyclotron resonance (ECR), dielectric etching equipment and the like. Alternatively, or additionally, the sensors can be incorporated into various deposition equipment including sputtering, chemical vapor deposition (CVD), and EPI equipment.

Figure 7:
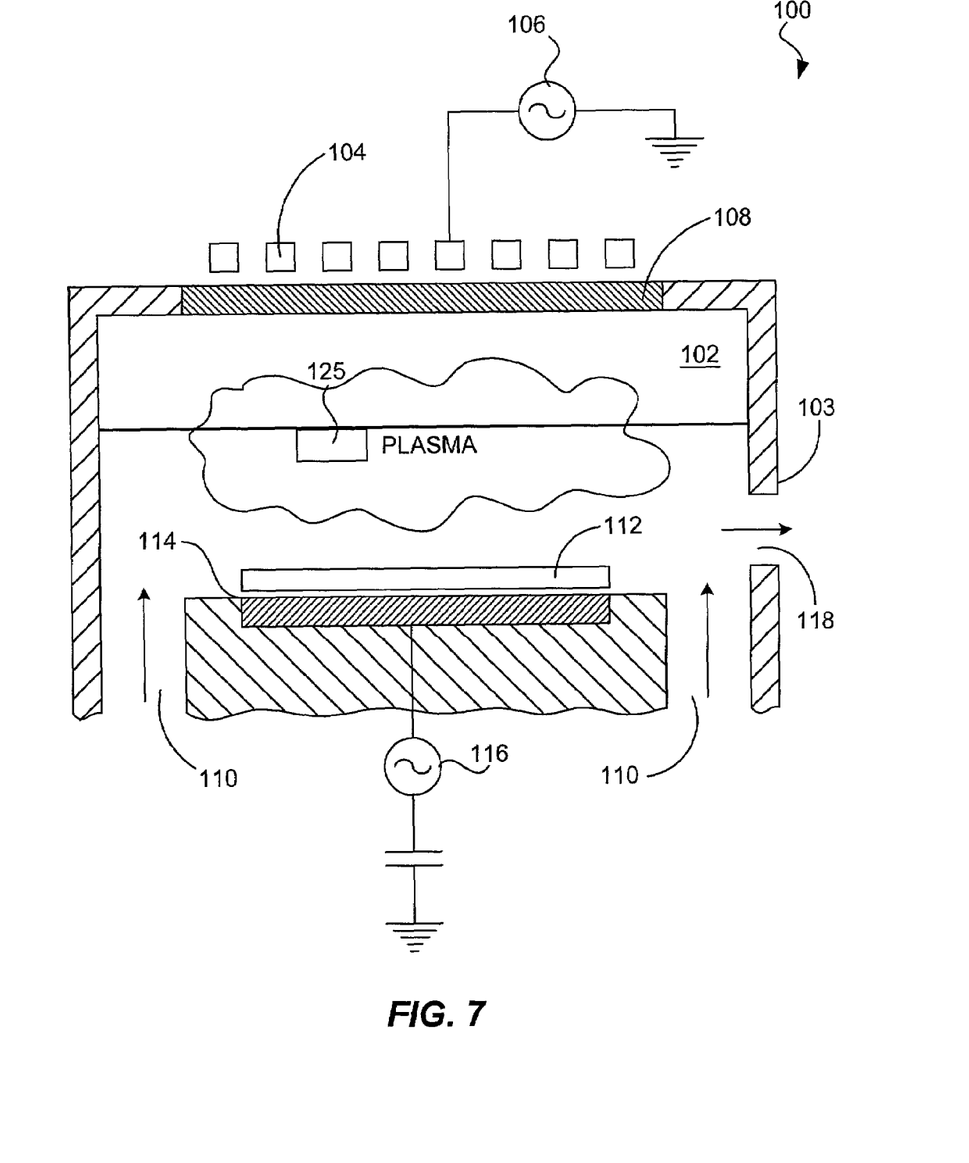
FIG. 7 is a diagrammatic illustration of an imager incorporated into an etching machine.

FIG. 7 diagrammatically illustrates a sensing tool (in the illustrated embodiment a CCD camera) mounted such that it may be ingressed into the plasma chamber for in situ detection of the test marks. The illustrated etching equipment takes the form of a plasma reactor 100 having a plasma processing chamber 102 with a chamber wall 103. However, it should be appreciated that the described sensing tool may be used with a wide variety of other plasma chambers or other etching equipment. An inductive electrode 104 is powered by a first RF power source 106 and a dielectric window 108 is disposed below inductive electrode 104. Typically, a gas port 110 is provided within chamber 102. Gas port 110 is arranged for releasing gaseous source materials, e.g., the etchant source gases, into the RF-induced plasma region between dielectric window 108 and a wafer 112. Alternatively, the gaseous source materials may also be released from ports built into the walls of the chamber itself or through a shower head arranged in the dielectric window. Wafer 112 is introduced into chamber 102 and disposed on a chuck 114, which acts as a bottom electrode. In the illustrated embodiment, the sensing tool takes the form of a CCD imager 125 which may travel over a guide bar to a position over the wafer to image the test marks.

As suggested above, since the area signal is proportional to the entire area of the mark, it is generally somewhat more efficient to measure the area as opposed to the length of the marks. The aforementioned area measurement tools (e.g., CCD cameras, channel electron multipliers, photodiodes) generally have the additional advantage that they do not need extensive scanning, specialized illumination sources or specialized optical devices. Further, the information concerning CD is gathered from an increased portion of the mark, increasing efficiency relative to required chip area. Thus, the measurement is largely insensitive to the quality of imaging of the mark on the sensor at the focal plane of the microscope.

Figure 5:
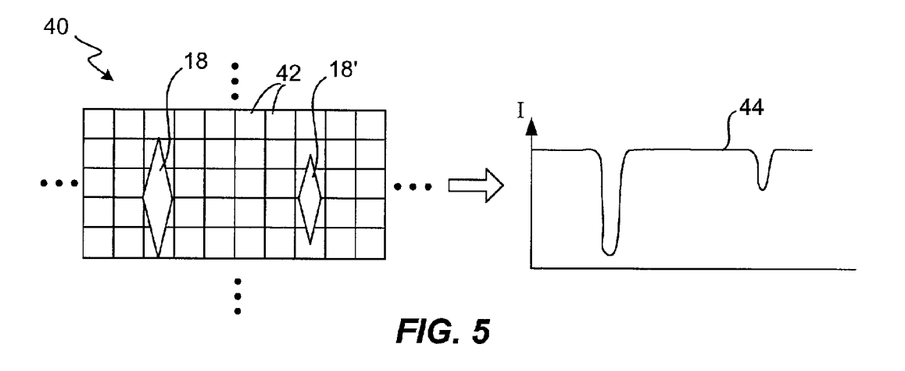
FIG. 5 diagrammatically illustrates the measurement of test marks using a CCD array.

In order to better illustrate some of the principles of the invention, a particular embodiment that incorporates a CCD sensor array will be described with reference to FIG. 5. A matrix array 40 of CCD sensor regions 42 is shown with test mark images 18, 18' (or a contour taken at a given intensity level) having different dimensions superimposed thereon. It should be understood that array 40 is representative of a small portion of an exemplary CCD sensor as is generally known in the art. However, the size of CCD sensor regions 42 is somewhat exaggerated in comparison with normal usage for the purposes of clarity. A graph showing the amplitude of the corresponding signal 44 output from the CCD sensor over time is also shown.

As is generally known, a CCD sensor includes numerous individual areas which can detect light. The charge developed at each area is proportional to the amount of light received. The charge, once developed at each sensor area, is shifted out of the CCD sensor along rows or columns to form a serial stream which can then be processed (e.g. integrated over plural rows) as desired to develop a signal 44 corresponding to the image reaching the CCD (or any other type) sensor. For illustrative purposes the magnitude of the variations between the test marks 18 and 18' has been exaggerated somewhat from what one would hope to find in production. However, it should be apparent that even small changes in the critical dimensions result in changes in the size of the resulting test marks that are readily detectable by monitoring the output of readily available CCD arrays.

It should also be appreciated that the image of a mark represents an intensity variation over some area and that marks with different CDs will have different intensity variations. Accordingly, it is not necessary to integrate the area signal over the entirety of the mark and the invention can be practiced over any sensor area or image area (e.g. corresponding to a plurality of sensor areas) on any portion of any intensity, contour of a mark image, even within a mark image since any sensor placed on the focal plane on any imaging arrangement employed will integrate the intensity signal over a given area. That is, when a mark size changes, both the mark contour and the intensity distribution will change accordingly.

Therefore, when area measurements are made (as opposed to length measurements) only a portion of the test marks may be imaged, as long as corresponding portions of the test marks are used, since the image intensity detected will accurately correspond to and vary with the critical dimension of the test mark. In this regard, it is considered preferable to utilize signals corresponding to a number of pixels 42 on the major diagonal of the mark which will yield maximum sensitivity to change of reflected or transmitted illumination. Also, the number of pixels on the major diagonal will be greatest in number across any dimension of the test mark and integration of signals therefrom will yield the largest signal-to-noise ratio while limitation of sensing to a single coordinate direction/dimension yields a reduction in image/signal capture time.

The described CCD array can be used with a wide variety of illumination sources. By way of example, a broadband (e.g. white) light works well as the illumination source. Therefore, the described detectors can readily be incorporated into etch chambers, lithographic exposures tools and/or virtually any other desired type of semiconductor manufacturing equipment.

As suggested above, it is generally desirable to calibrate the test structure measurement tool in order to get meaningful data. Calibration is a relatively simple procedure regardless of whether the length or area of the mark is being measured. By way of example, when measuring the area of a mark, the sensor output will generally be proportional to mark area, and calibration can readily be performed with relatively large marks that can be directly measured to determine the constant of proportionality, K, as shown at 56. (It should be noted that most sensors, including CCD devices, will generally exhibit some degree of non-linearity of output with varying illumination but, as will be evident to those skilled in the art, variations in K can be empirically determined and compensated through appropriate calibration.) Of course, the magnitude of K will vary with the material used in the layer of interest that constitutes the mark, its surface texture, spectral reflectance etc. Once K is determined, CD can be simply determined from the sensor signal by computing the square root of the sensor signal and multiplying by the proportionality constant (as calibrated).

Although only a few embodiments of the present invention have been described in detail, it should be understood that the present invention may be embodied in many other specific forms without departing from the spirit or scope of the invention. As alluded to above, the described methodology for creating and/or measuring test marks indicative of critical dimensions can be useful at a number of different stages in the development and production cycle. For example, the described methodology may be useful during the characterization of an etching (or other feature formation) process, during calibration of such processes or the equipment used to perform such processes, during the calibration of the sensing tool, and/or during actual manufacturing of integrated circuits or other structures (e.g. biometric micro-arrays, MEMS (Micro-Electro-Mechanical Systems), etc.) that utilize wafer processing techniques.

A wide variety of sensors can be used to detect a geometric aspect of the test marks that are indicative of the critical dimensions of interest. By way of example, the sensors may be arranged to measure either (or both) the length and area of the marks. In some production related applications it will be desirable to pull the wafers to be tested from the production line for inspection. In other production related applications it will be desirable to incorporate the sensors directly into the manufacturing equipment so that the measurements can be made without requiring removal of the inspected wafers from the normal production path.

The invention has been primarily described in the context of embodiments that define the test marks by partially exposing a pair of overlapping straight line segments in a resist layer wherein the lines have widths that are equal to a critical dimension of interest. Although these embodiments are preferred in most applications due to their simplicity, it should be appreciate that the overlapping lines do not necessarily need to be straight, and the line widths do not necessarily need to be equal to the critical dimension of interest.

As suggested above, the appropriate lithographic exposure doses used to activate the resist will depend in great part on the nature of the resist being used. It should be apparent that the test marks can be formed in either positive or negative resists. Therefore, the present examples are to be considered as illustrative and not restrictive, and the invention is not to be limited to the details given herein, but may be modified within the scope of the appended claims.

What is claimed is:

1. A method of determining a critical dimension associated with an etch process comprising:
    forming a test mark in a device, wherein the test mark is formed at least in part by imaging overlapping, angularly offset lines in a resist that covers a selected layer to define the test mark and thereafter etching at least the selected layer to form the test mark;
    detecting at least a portion of the test mark to determine a geometric parameter of the test mark; and
    approximating a critical dimension of interest based at least in part on the determined geometric parameter of the test mark.

2. A method as recited in claim 1 wherein the detecting includes imaging the test mark to obtain information indicative of the area of the test mark.

3. A method as recited in claim 1 wherein the detecting includes measuring the test mark to obtain information indicative of the length of the test mark.

4. A method as recited in claim 1 wherein the overlapping lines are a pair of straight lines that are formed at an angle relative to one another.

5. A method as recited in claim 4 wherein the angle is less than approximately 10.0 degrees.

6. A method as recited in claim 4 wherein the angles is at least approximately 0.2 degrees.

7. A method as recited in claim 1 wherein the selected layer that the test mark is formed in is selected from the group consisting of a bulk layer, a semiconductor layer, an insulator layer, and a conductive layer.

8. A method as recited in claim 1 wherein the selected layer that the test mark is formed in is selected from the group consisting of a silicon layer, an interconnect layer, a polysilicon layer, an autoreflective layer, a silicon nitride layer, a silicon oxide layer, and a silicon dioxide layer.

9. A method as recited in claim 1 wherein approximating the critical dimension of interest includes determining a width of at least one of the lines used to create the test mark.

10. A method as recited in claim 1 wherein:
   approximating the critical dimension of interest includes determining a width of at least one of the lines used to create the test mark;
   the overlapping lines are a pair of straight lines that are formed at an angle (2α) relative to one another;
   the test mark is imaged to obtain information indicative of the length (L) of the test mark; and
   the determined line width (CD) is calculated using the formula $$CD=[L*\sin(\alpha)]/K$$

or a formula that is substantially the mathematical equivalent thereof, wherein K is an empirically determined adjustment factor and a is an angle between the intersecting lines.

11. A method as recited in claim 1 wherein:
   approximating the critical dimension of interest includes determining a width of at least one of the lines used to create the test mark;
   the overlapping lines are a pair of straight lines that are formed at an angle (2α) relative to one another;
   the test mark is imaged to obtain information indicative of the area (A) of the test mark; and
   the determined line width (CD) is calculated using the formula $$A=[K*CD^2]/\sin(2\alpha)]$$

or a formula that is substantially the mathematical equivalent thereof, wherein K is an empirically determined adjustment factor.

12. A method as recited in claim 1 wherein the selected layer that the test mark is formed in is an interconnect layer formed from a material selected from the group consisting of aluminum, copper, tungsten, and a titanium-tungsten alloy.

13. A method as recited in claim 1 wherein the device is a wafer having a multiplicity of integrated circuits formed thereon.

14. A method as recited in claim 1 wherein the approximation of the critical dimension of interest includes a geometric calculation based on the determined geometric parameter factored by an empirically determined normalization factor.

15. A method as recited in claim 14 wherein the empirically determined normalization factor is a constant.

16. A method as recited in claim 1 wherein the imaging is performed by a sensor system incorporated into an etch machine.

17. A method as recited in claim 1 wherein the imaging is performed by a measurement device that is separate from an etch machine used to etch the selected layer.

18. A method as recited in claim 1 wherein the approximation of the critical dimension of interest includes a geometric calculation based on the determined geometric parameter factored by an empirically determined normalization factor.

19. A wafer having a multiplicity of test marks formed as recited in claim 1.

20. An integrated circuit having at least one test mark formed as recited in claim 1.

21. A method of characterizing a semiconductor wafer etch process, the method comprising:
   forming a test mark in a semiconductor wafer, wherein the test mark is formed at least in part by imaging overlapping, angularly offset straight lines in a resist that covers a selected layer to define the test mark and thereafter etching at least the selected layer to form the test mark, wherein the angular offset is in the range of approximately 0.2 to 10 degrees;
   detecting at least a portion of the test mark to determine a geometric parameter of the test mark indicative of at least one of the length of the test mark or an area of at least a portion of the test mark; and
   approximating a critical dimension of interest based at least in part on the determined geometric parameter of the test mark.

22. A method of forming and utilizing a test mark that is indicative of a critical dimension of an etched feature, the method comprising:
   making a first partial lithographic exposure to define a first line in a resist positioned over a layer of interest, wherein the partial exposure is at a reduced power level relative to a power level used to define other features in the resist;
   making a second partial lithographic exposure to define a second line in the resist, wherein the second line overlaps, but is angularly offset from the first line;
   developing and stripping the resist to define a resist test feature;
   etching the layer of interest, whereby the etching forms a test marks defined by the resist test feature; and
   imaging at least a portion of the test mark to facilitate the determination of a geometric parameter of the test mark.

23. A method as recited in claim 22 further comprising approximating a critical dimension of interest based at least in part on the determined geometric parameter of the test mark.

24. A method as recited in claim 23 wherein the approximation of the critical dimension of interest includes a geometric calculation based on the determined geometric parameter factored by an empirically determined normalization factor.

25. A method as recited in claim 24 wherein the empirically determined normalization factor is a constant.

26. An etching machine comprising:
   an etch chamber suitable for etching wafers;
   a detector configured for detecting a geometric characteristic selected from the group consisting of the area or length of etched test marks defined on wafers that are created during an etch process in the etch chamber, wherein the test marks are somewhat diamond shaped marks formed at least in part by imaging overlapping, angularly offset straight lines in a sacrificed resist that covered the selected layer to define the test marks and thereafter etching at least the selected layer to form the test marks, wherein the test marks are sized and positioned in a manner so that detection of the geometric parameter facilitates approximation of a critical dimension of interest based at least in part of the detected geometric parameter of the test mark.

27. An etching machine as recited in claim 26 wherein the detector is an imager suitable for imaging the test marks to determine a parameter indicative of the area of the test marks.

28. An etching machine as recited in claim 26 wherein the detector is a CCD camera.

29. An etching machine as recited in claim 26 wherein the detector is configured to gather data indicative of the length of the test marks.

30. A wafer comprising a multiplicity of test marks formed in a selected etched layer, wherein the test marks are somewhat diamond shaped marks formed at least in part by imaging overlapping, angularly offset straight lines each having a width indicative of a critical dimension of interest in a sacrificed resist that covered the selected layer to define the test marks and thereafter etching at least the selected layer to form the test marks, wherein the angular offset is in the range of approximately 0.2 to 10 degrees, the test marks being sized and positioned in a manner to facilitate detection of a geometric parameter of the test marks in order to approximate the critical dimension of interest based at least in part of the detected geometric parameter of the test mark.

* * * * *

UNITED STATES PATENT AND TRADEMARK OFFICE
CERTIFICATE OF CORRECTION

PATENT NO. : 6,956,659 B2  Page 1 of 1
DATED : October 18, 2005
INVENTOR(S) : Ilya Grodnensky It is certified that error appears in the above-identified patent and that said Letters Patent is hereby corrected as shown below:

Column 13,
Line 25, change "and a is" to -- and $\alpha$ is --.

Signed and Sealed this

Second Day of May, 2006

JON W. DUDAS
*Director of the United States Patent and Trademark Office*